(12) United States Patent
Bouche et al.

(10) Patent No.: US 9,520,395 B2
(45) Date of Patent: Dec. 13, 2016

(54) FINFET DEVICES COMPRISING A DIELECTRIC LAYER/CMP STOP LAYER/HARDMASK/ETCH STOP LAYER/GAP-FILL MATERIAL STACK

(71) Applicant: GLOBALFOUNDRIES INC., Grand Cayman (KY)

(72) Inventors: Guillaume Bouche, Albany, NY (US); Andy Wei, Queensbury, NY (US); Xiang Hu, Clifton Park, NY (US); Jerome F. Wandell, Saratoga Springs, NY (US); Sandeep Gaan, Malta, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/949,481

(22) Filed: Nov. 23, 2015

(65) Prior Publication Data

US 2016/0079242 A1  Mar. 17, 2016

Related U.S. Application Data

(62) Division of application No. 14/258,488, filed on Apr. 22, 2014, now Pat. No. 9,224,842.

(51) Int. Cl.
| | |
|---|---|
| *H01L 29/66* | (2006.01) |
| *H01L 27/088* | (2006.01) |
| *H01L 29/78* | (2006.01) |
| *H01L 21/02* | (2006.01) |
| *H01L 29/417* | (2006.01) |

(52) U.S. Cl.
CPC ..... *H01L 27/0886* (2013.01); *H01L 21/02488* (2013.01); *H01L 29/41791* (2013.01); *H01L 29/66795* (2013.01); *H01L 29/785* (2013.01); *H01L 29/66545* (2013.01); *H01L 2029/7858* (2013.01)

(58) Field of Classification Search
CPC .......................... H01L 21/02488; H01L 29/785
USPC .......................................................... 257/365
See application file for complete search history.

(56) References Cited

U.S. PATENT DOCUMENTS

| 6,627,539 B1 * | 9/2003 | Zhao ................. H01L 21/76807 257/E21.579 |
| 7,851,328 B2 | 12/2010 | Liao et al. |
| 7,998,810 B2 * | 8/2011 | Kim ................... H01L 21/28273 257/E21.409 |

(Continued)

*Primary Examiner* — Caleb Henry
(74) *Attorney, Agent, or Firm* — Williams Morgan, P.C.

(57) ABSTRACT

Provided are approaches for patterning multiple, dense features in a semiconductor device using a memorization layer. Specifically, an approach includes: patterning a plurality of openings in a memorization layer; forming a gap-fill material within each of the plurality of openings; removing the memorization layer; removing an etch stop layer adjacent the gap-fill material, wherein a portion of the etch stop layer remains beneath the gap-fill material; etching a hardmask to form a set of openings above the set of gate structures, wherein the etch to the hardmask also removes the gap-fill material from atop the remaining portion of the etch stop layer; and etching the semiconductor device to remove the hardmask within each of the set of openings. In one embodiment, a set of dummy S/D contact pillars is then formed over a set of fins of the semiconductor device by etching a dielectric layer selective to the gate structures.

8 Claims, 7 Drawing Sheets

(56) References Cited

U.S. PATENT DOCUMENTS

| | | | |
|---|---|---|---|
| 8,133,795 B2 | 3/2012 | Funayama et al. | |
| 8,158,478 B2 | 4/2012 | Yan et al. | |
| 8,569,144 B2 | 10/2013 | Funayama et al. | |
| 2009/0087973 A1* | 4/2009 | Walker | H01L 27/12 438/591 |
| 2009/0227080 A1* | 9/2009 | Jeon | H01L 21/76802 438/257 |
| 2010/0075480 A1 | 3/2010 | Liao et al. | |
| 2010/0124813 A1* | 5/2010 | Matamis | G11C 13/0004 438/478 |
| 2011/0121366 A1* | 5/2011 | Or-Bach | H01L 21/6835 257/204 |
| 2011/0133285 A1* | 6/2011 | Liaw | H01L 27/0207 257/368 |
| 2011/0180866 A1* | 7/2011 | Matsuda | H01L 27/11573 257/324 |
| 2011/0204433 A1* | 8/2011 | Fujita | H01L 27/11524 257/326 |
| 2011/0291196 A1* | 12/2011 | Wei | H01L 29/785 257/365 |
| 2012/0032273 A1* | 2/2012 | Suzuki | H01L 21/823814 257/369 |
| 2012/0208361 A1* | 8/2012 | Ha | H01L 21/0337 438/597 |
| 2012/0225546 A1* | 9/2012 | Kamiya | H01L 27/11546 438/591 |
| 2012/0295409 A1* | 11/2012 | Yun | H01L 27/11582 438/268 |
| 2012/0326328 A1* | 12/2012 | Li | H01L 23/481 257/774 |
| 2013/0059432 A1* | 3/2013 | Lee | H01L 21/28282 438/488 |
| 2013/0154002 A1* | 6/2013 | Kuo | H01L 29/66795 257/347 |
| 2014/0097482 A1* | 4/2014 | Tokunaga | H01L 21/28273 257/316 |
| 2014/0113432 A1* | 4/2014 | Ching | H01L 29/66818 438/424 |
| 2014/0124873 A1* | 5/2014 | Jagannathan | H01L 29/49 257/407 |
| 2014/0248763 A1* | 9/2014 | Konevecki | H01L 21/28008 438/591 |
| 2014/0256094 A1* | 9/2014 | Lin | H01L 29/66545 438/158 |
| 2014/0264546 A1* | 9/2014 | Lai | H01L 27/11568 257/324 |
| 2014/0264903 A1* | 9/2014 | Chen | H01L 23/5329 257/774 |
| 2014/0327076 A1* | 11/2014 | Jagannathan | H01L 29/49 257/347 |
| 2015/0060959 A1* | 3/2015 | Lin | H01L 29/785 257/288 |
| 2015/0228762 A1* | 8/2015 | He | H01L 29/66795 257/410 |
| 2015/0235948 A1* | 8/2015 | Song | H01L 23/5283 257/368 |
| 2015/0243739 A1* | 8/2015 | Chen | H01L 29/7851 257/623 |
| 2016/0071907 A1* | 3/2016 | Inaba | H01L 27/228 257/252 |

* cited by examiner

FINFET DEVICES COMPRISING A DIELECTRIC LAYER/CMP STOP LAYER/HARDMASK/ETCH STOP LAYER/GAP-FILL MATERIAL STACK

CROSS-REFERENCE TO RELATED APPLICATIONS

This application is a divisional of co-pending application Ser. No. 14/258,488 filed Apr. 22, 2014.

BACKGROUND

Technical Field

This invention relates generally to the field of semiconductors, and more particularly, to approaches used in forming a set of dummy mask pillars in a semiconductor device.

Related Art

A typical integrated circuit (IC) chip includes a stack of several levels or sequentially formed layers of shapes. Each layer is stacked or overlaid on a prior layer and patterned to form the shapes that define devices (e.g., fin-type field effect transistors (FinFETs)) and connect the devices into circuits. In a typical state of the art complementary insulated gate FinFET process, such as what is normally referred to as CMOS, layers are formed on a wafer to form the devices on a surface of the wafer. Further, the surface may be the surface of a silicon layer on a silicon on insulator (SOI) wafer. A simple FinFET is formed by the intersection of two shapes, i.e., a gate layer rectangle on a silicon island formed from the silicon surface layer. Each of these layers of shapes, also known as mask levels or layers, may be created or printed optically through well-known photolithographic masking, developing and level definition, e.g., etching, implanting, deposition, etc.

In current art approaches, middle of line (MOL) processing for 14 nm (or smaller) FinFET fully encapsulates the gate in nitride. A contact to SD is etched through oxide, selectively to nitride (TS level). This contact may be self-aligned. After TS metallization and CMP, an Inter-Layer Dielectric (ILD) film is deposited, and the S/D contact to TS and gate contact are processed. However, this becomes increasingly problematic at sub 10 nm processing due to density requirements.

SUMMARY

In general, provided are approaches for patterning multiple, dense features in a semiconductor device using a memorization layer. Specifically, an approach includes: patterning a plurality of openings in a memorization layer; forming a gap-fill material within each of the plurality of openings; removing the memorization layer; removing an etch stop layer adjacent the gap-fill material, wherein a portion of the etch stop layer remains beneath the gap-fill material; etching a hardmask to form a set of openings above the set of gate structures, wherein the etch to the hardmask also removes the gap-fill material from atop the remaining portion of the etch stop layer; and etching the semiconductor device to remove the hardmask within each of the set of openings. In one embodiment, a set of dummy S/D contact pillars is then formed over a set of fins of the semiconductor device by etching a dielectric layer selective to the set of gate structures.

One aspect of the present invention includes a method of forming a semiconductor device, the method comprising: providing a stack of layers formed over a set of gate structures, the stack of layers including a dielectric layer over the set of gate structures, a chemical mechanical planarization stop layer (CMPSL) over the dielectric layer, a hardmask over the CMPSL, an etch stop layer over the hardmask, and a memorization layer over the etch stop layer; patterning a plurality of openings in the memorization layer; forming a gap-fill material within each of the plurality of openings; removing the memorization layer; removing the etch stop layer adjacent the gap-fill material, wherein a portion of the etch stop layer remains beneath the gap-fill material; and etching the hardmask to form a set of openings above the set of gate structures, wherein the etch to the hardmask also removes the gap-fill material from atop the remaining portion of the etch stop layer.

Another aspect of the present invention includes a method for patterning multiple, dense features in a semiconductor device using a memorization layer, the method comprising: providing a stack of layers formed over a set of gate structures, the stack of layers including a dielectric layer over the set of gate structures, a chemical mechanical planarization stop layer (CMPSL) over the dielectric layer, a hardmask over the CMPSL, an etch stop layer over the hardmask, and a memorization layer over the etch stop layer; patterning a plurality of openings in the memorization layer; forming a gap-fill material within each of the plurality of openings; removing the memorization layer; removing the etch stop layer adjacent the gap-fill material, wherein a portion of the etch stop layer remains beneath the gap-fill material; and etching the hardmask to form a set of openings above the set of gate structures, wherein the etch to the hardmask also removes the gap-fill material from atop the remaining portion of the etch stop layer.

Another aspect of the present invention includes a semiconductor device comprising: a set of gate structures over a set of fins within a substrate; a set of layers formed over the set of gate structures, the set of layers including a dielectric layer over the set of gate structures, a chemical mechanical planarization stop layer (CMPSL) over the dielectric layer, and a hardmask over the CMPSL; and an etch stop layer and a gap-fill material formed over the hardmask in an area of the semiconductor device above the set of fins and adjacent to each of the set of gate structures.

BRIEF DESCRIPTION OF THE DRAWINGS

These and other features of this invention will be more readily understood from the following detailed description of the various aspects of the invention taken in conjunction with the accompanying drawings in which.

Figure 1:
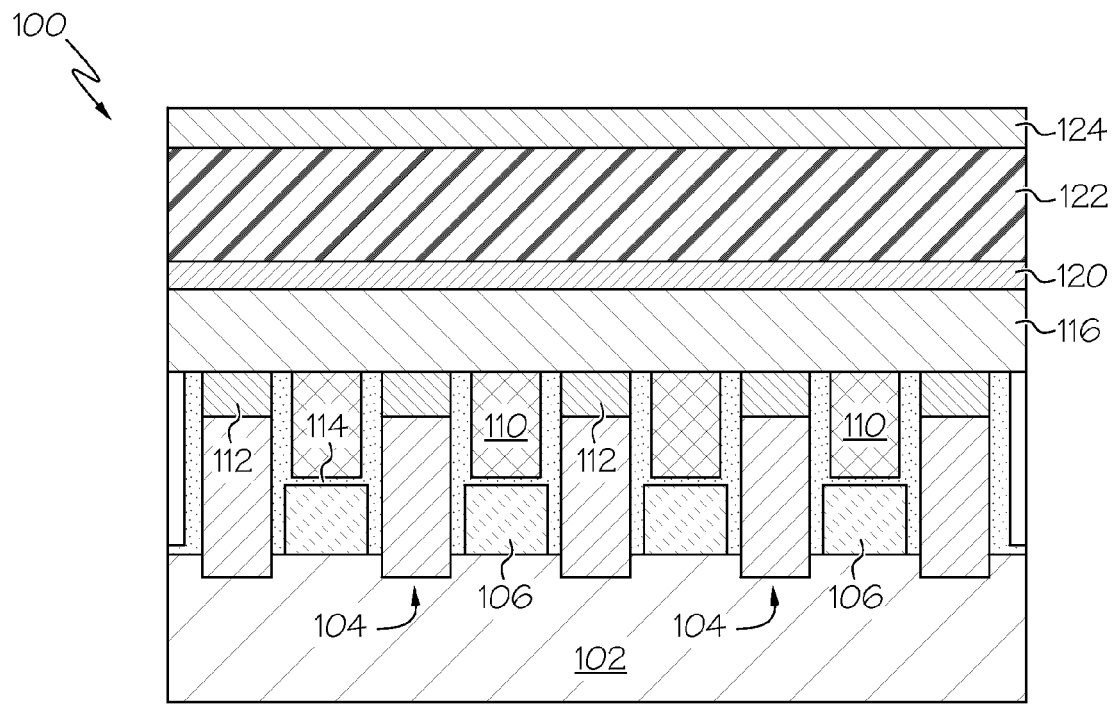
FIG. 1 shows a side cross-sectional view of a semiconductor device having a set of gate structures formed over a substrate and a stack of layers formed over the set of gate structures according to illustrative embodiments.

The drawings are not necessarily to scale. The drawings are merely representations, not intended to portray specific parameters of the invention. The drawings are intended to depict only typical embodiments of the invention, and therefore should not be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines, which would otherwise be visible in a "true" cross-sectional view, for illustrative clarity. Furthermore, for clarity, some reference numbers may be omitted in certain drawings.

DETAILED DESCRIPTION

Exemplary embodiments will now be described more fully herein with reference to the accompanying drawings, in which one or more approaches are shown. It will be appreciated that this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art. The terminology used herein is for the purpose of describing particular embodiments only and is not intended to be limiting of this disclosure. For example, as used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," "exemplary embodiments," or similar language means that a particular feature, structure, or characteristic described in connection with the embodiment is included in at least one embodiment of the present invention. Thus, appearances of the phrases "in one embodiment," "in an embodiment," "in embodiments" and similar language throughout this specification may, but do not necessarily, all refer to the same embodiment.

The terms "overlying" or "atop", "positioned on" or "positioned atop", "underlying", "beneath" or "below" mean that a first element, such as a first structure, e.g., a first layer, is present on a second element, such as a second structure, e.g. a second layer, wherein intervening elements, such as an interface structure, e.g. interface layer, may be present between the first element and the second element.

As used herein, "depositing" may include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation, etc.

As stated above, provided herein are approaches for patterning multiple, dense features in a semiconductor device using a memorization layer. Specifically, an approach includes: patterning a plurality of openings in a memorization layer; forming a gap-fill material within each of the plurality of openings; removing the memorization layer; removing an etch stop layer adjacent the gap-fill material, wherein a portion of the etch stop layer remains beneath the gap-fill material; etching a hardmask to form a set of openings above the set of gate structures, wherein the etch to the hardmask also removes the gap-fill material from atop the remaining portion of the etch stop layer; and etching the semiconductor device to remove the hardmask within each of the set of openings. In one embodiment, a set of dummy S/D contact pillars is then formed over a set of fins of the semiconductor device by etching a dielectric layer selective to the set of gate structures.

With reference now to the figures, FIG. 1 shows a semiconductor device 100 (e.g., a FinFET device) having a substrate 102 and a set of gate structures 104 (e.g., replacement metal gates (RMG)) formed over substrate 102. Device 100 further comprises a set of fins 106 formed from substrate 102, and an oxide material 110 formed between each of gate structures 104.

The term "substrate" used herein is intended to include a semiconductor substrate, a semiconductor epitaxial layer deposited or otherwise formed on a semiconductor substrate and/or any other type of semiconductor body, and all such structures are contemplated as falling within the scope of the present invention. For example, the semiconductor substrate may comprise a semiconductor wafer (e.g., silicon, SiGe, or an SOL wafer) or one or more die on a wafer, and any epitaxial layers or other type of semiconductor layers formed thereover or associated therewith. A portion or the entire semiconductor substrate may be amorphous, polycrystalline, or single-crystalline. In addition to the aforementioned types of semiconductor substrates, the semiconductor substrate employed in the present invention may also comprise a hybrid oriented (HOT) semiconductor substrate in which the HOT substrate has surface regions of different crystallographic orientation. The semiconductor substrate may be doped, undoped or contain doped regions and undoped regions therein. The semiconductor substrate may contain regions with strain and regions without strain therein, or contain regions of tensile strain and compressive strain.

Gate structures 104 are shown following a Replacement Metal Gate (RMG) formation process and a self-aligned contact (SAC) SiN cap CMP in which each gate structure 104 is opened and then filled with a gate dielectric and metal stack (e.g., HfO2 as gate dielectric, TIN and W as gate metal), a spacer protection layer (e.g., SiN or SiOCN low k) along the sidewalk of the metal stack, and a gate capping layer 112 (e.g., SiN or SiOCN low k). Gate capping layer 112 is formed by recessing, with etch, the metal gate and then depositing SiN followed by chemical mechanical planarization (CMP). As understood to those skilled in the art, the CMP process involves contacting a material layer to be polished with a rotating polishing pad. An abrasive slurry comprising an abrasive suspended in an aqueous solution, which may also contain chemical constituents to achieve selectively, is disposed between the polishing pad and the material layer to be polished. The material layer to be polished is then polished away with the polish pad and slurry to achieve a desired removal.

Fins 106 may be fabricated using any suitable process including one or more photolithography and etch processes. The photolithography process may include forming a photoresist layer (not shown) overlying substrate 102 (e.g., on a silicon layer), exposing the resist to a pattern, performing post-exposure bake processes, and developing the resist to form a masking element including the resist. The masking element may then be used to etch fins 106 into the silicon layer, e.g., using reactive ion etch (RIE) and/or other suitable processes. In one embodiment, fins 106 are formed using a sidewall image transfer technique. In yet another embodiment, fins 106 are formed by a double-patterning lithography (DPL) process. DPL is a method of constructing a pattern on a substrate by dividing the pattern into two interleaved patterns. DPL allows enhanced feature (e.g., fin) density. Various DPL methodologies may be used including, but not limited to, double exposure (e.g., using two mask sets), forming spacers adjacent features and removing the features to provide a pattern of spacers, resist freezing, and/or other suitable processes.

The resulting structure includes set of fins 106 having sidewalls being substantially orthogonal to a top surface of substrate 102. In an alternative embodiment, fins 106 may be epitaxially grown from a top surface of substrate 102 within trenches or openings formed in a patterned layer atop substrate 102. Fins 106 serve as the fin structure for device 100. The FinFET device may comprise a single fin or multiple fins. As shown in FIG. 1, a nitride layer 114 is formed atop each of fins 106 after the gate RMG process so as to act as a contact etch stop layer (CESL) during further processing of the source/drain contact etch.

Although not specifically shown for the sake of brevity, semiconductor 100 further includes a set of S/D features formed on opposite sides of a channel region. The S/D features may be formed by recessing a portion of substrate 102 to form source/drain recessing trenches and epitaxially growing a semiconductor material layer in the sources/drains recessing trenches. The semiconductor material layer includes element semiconductor material such as germanium (Ge) or silicon (Si); or compound semiconductor materials, such as gallium arsenide (GaAs), aluminum gallium arsenide (AlGaAs); or semiconductor alloy, such as silicon germanium (SiGe), or gallium arsenide phosphide (GaAsP). The epitaxial processes include CVD deposition techniques (e.g., vapor-phase epitaxy (VPE) and/or ultra-high vacuum CVD molecular beam epitaxy, and/or other suitable processes. The S/D features may be formed by one or more epitaxy or epitaxial (epi) processes. The S/D features may be in-situ doped during the epi process. For example, the epitaxially grown SiGe S/D features may be doped with boron; and the epitaxially grown Si epi S/D features may be doped with carbon to form Si:C source/drain features, phosphorous to form Si:P source/drain features, or both carbon and phosphorous to form SiCP source/drain features. In one embodiment, the S/D features are not in-situ doped. Instead, an implantation process (i.e., a junction implant process) is performed to dope the S/D features. One or more annealing processes may be performed to activate source/drain epitaxial feature. The annealing processes comprise rapid thermal annealing (RTA) and/or laser annealing processes.

Device 100 further includes a set of stacked layers formed over set of gate structures 104. In at least one embodiment, the stacked layers include a dielectric layer 116 (e.g., an oxide such as tetra ethyl ortho silicate (TEOS)) formed over set of gate structures 104, a CMP stop layer (CMPSL) 120 over dielectric layer 116, a thick hardmask 122 over CMPSL 120, and an etch stop layer 124 over hardmask 122. In an exemplary embodiment, dielectric layer 116 comprises TEOS, CMPSL 120 comprises nitride, etch stop layer 124 comprises silicon oxynitride, and hardmask 122 comprises amorphous-carbon (a-C) deposited via CVD or spun-on using a track tool.

Figure 2:
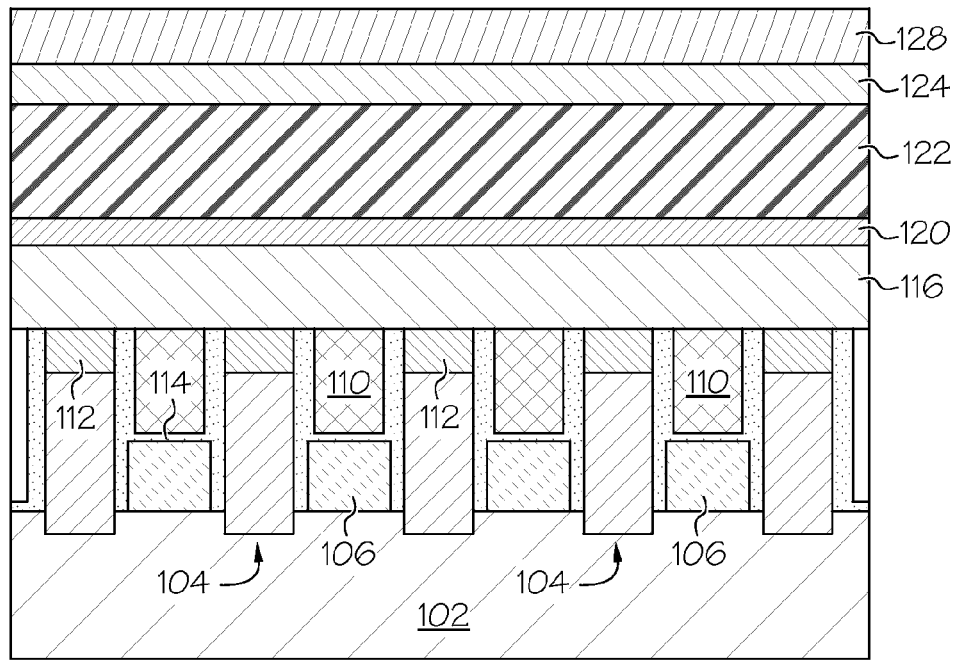
FIG. 2 shows a side cross-sectional view of the semiconductor device including a memorization layer formed over the stack of layers according to illustrative embodiments.

As shown in FIG. 2, a memorization layer 128 is then formed over etch stop layer 124. In various embodiments, memorization layer 128 may include one of: TEOS, low temperature oxide (LTO), deep ultraviolet light absorbing oxide (DUO), a low-temperature a-Si, or poly silicon. In an exemplary embodiment, memorization layer 128 is at least 400A thick to enable sufficient contrast for overlay (OVL).

Figure 3:
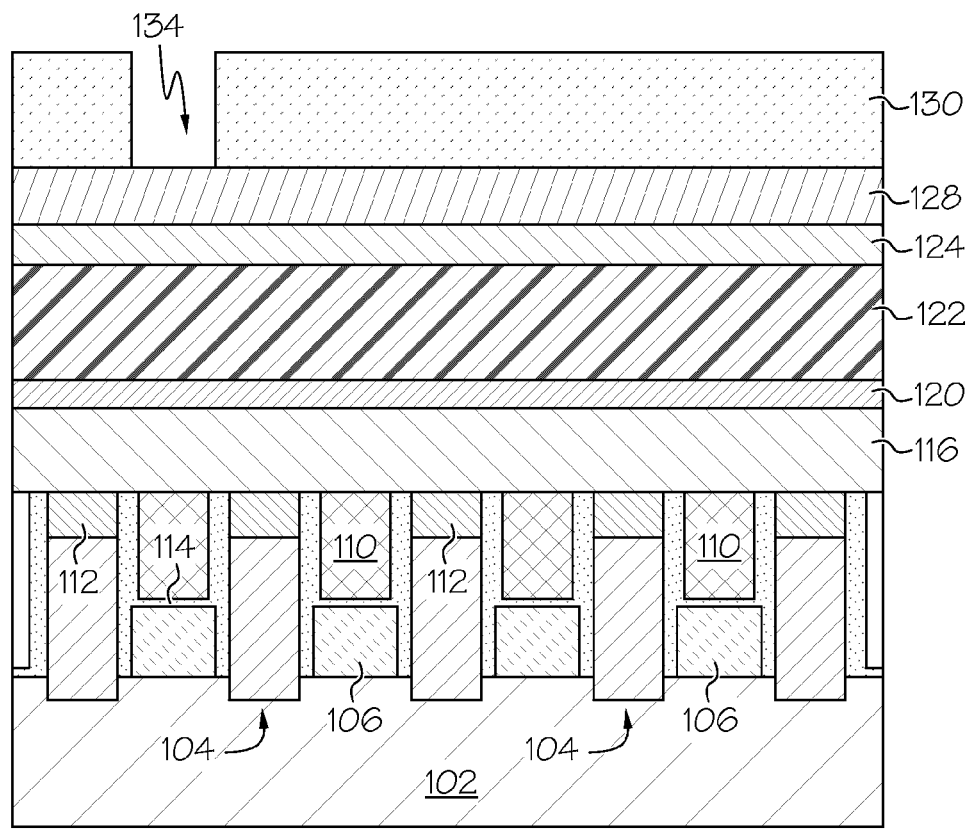
FIG. 3 shows a side cross-sectional view of the semiconductor device including a patterned lithography mask according to illustrative embodiments.
Figure 4:
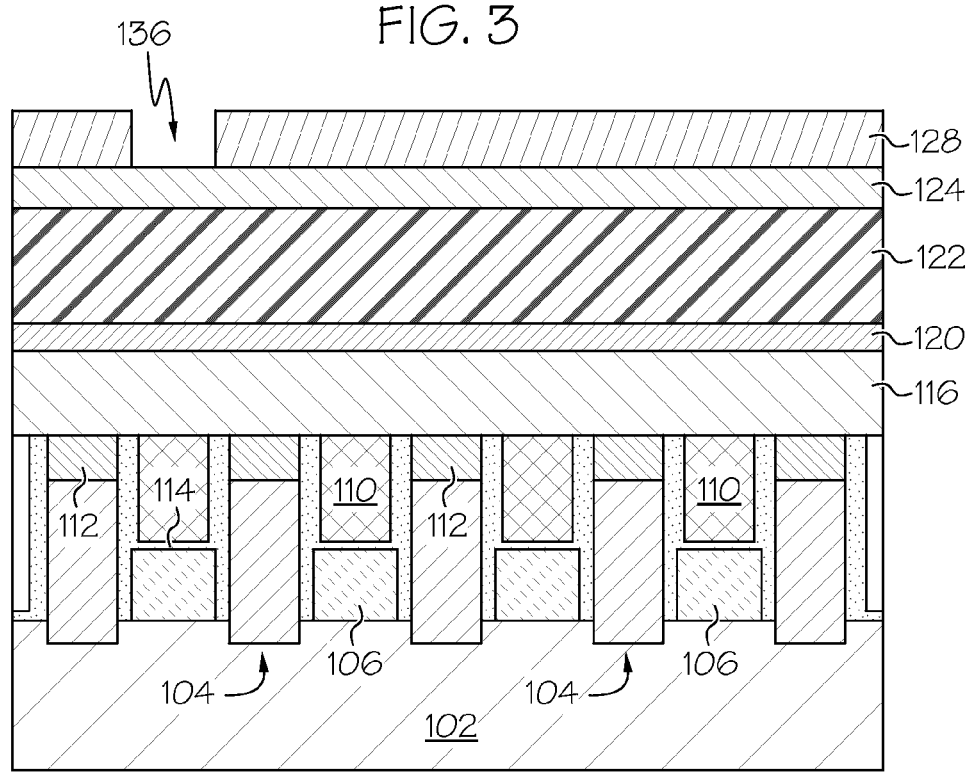
FIG. 4 shows a side cross-sectional view of the semiconductor device including a first contact opening formed in the memorization layer according to illustrative embodiments.
Figure 5:
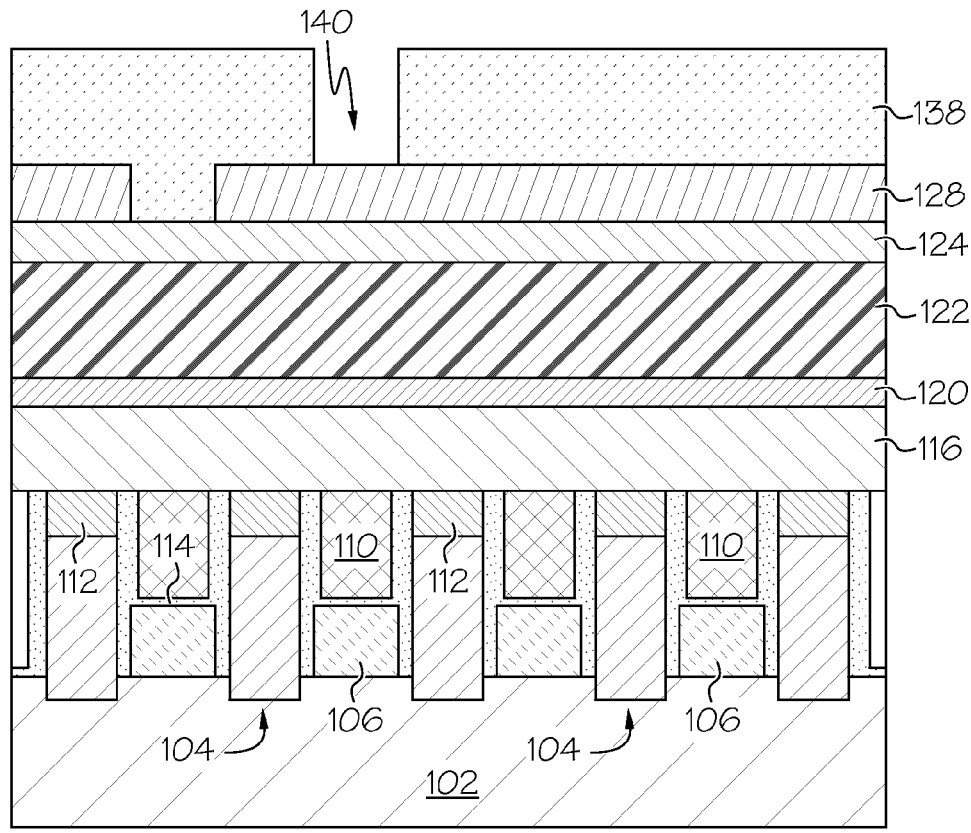
FIG. 5 shows a side cross-sectional view of the semiconductor device including a patterned lithography mask according to illustrative embodiments.
Figure 6:
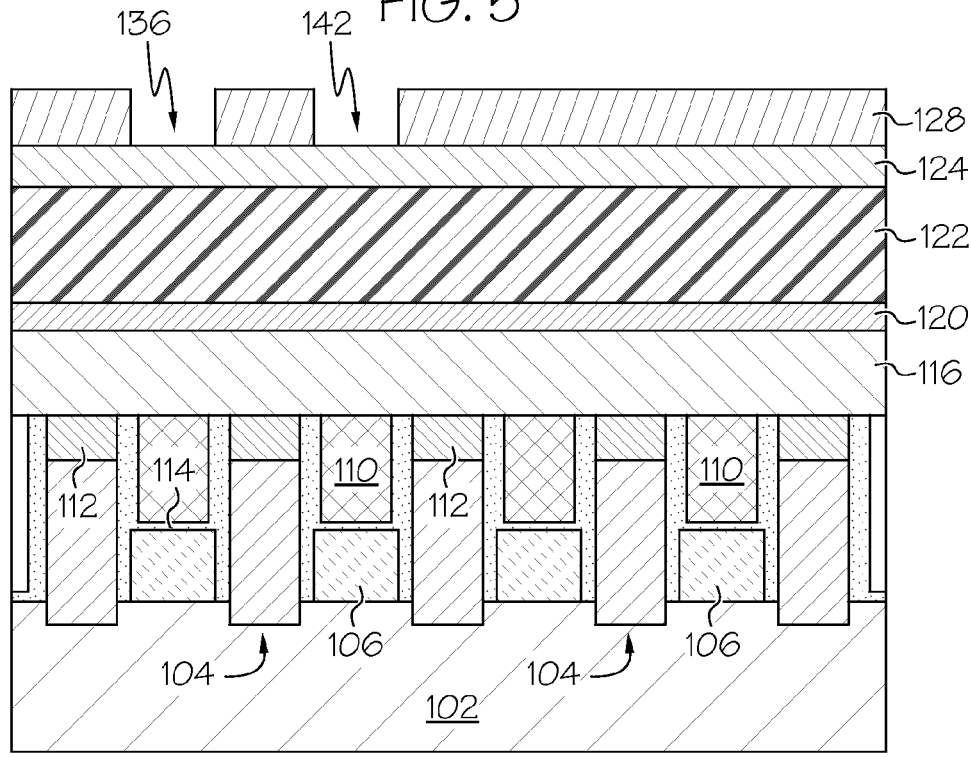
FIG. 6 shows a side cross-sectional view of the semiconductor device including a second contact opening formed in the memorization layer according to illustrative embodiments.
Figure 7:
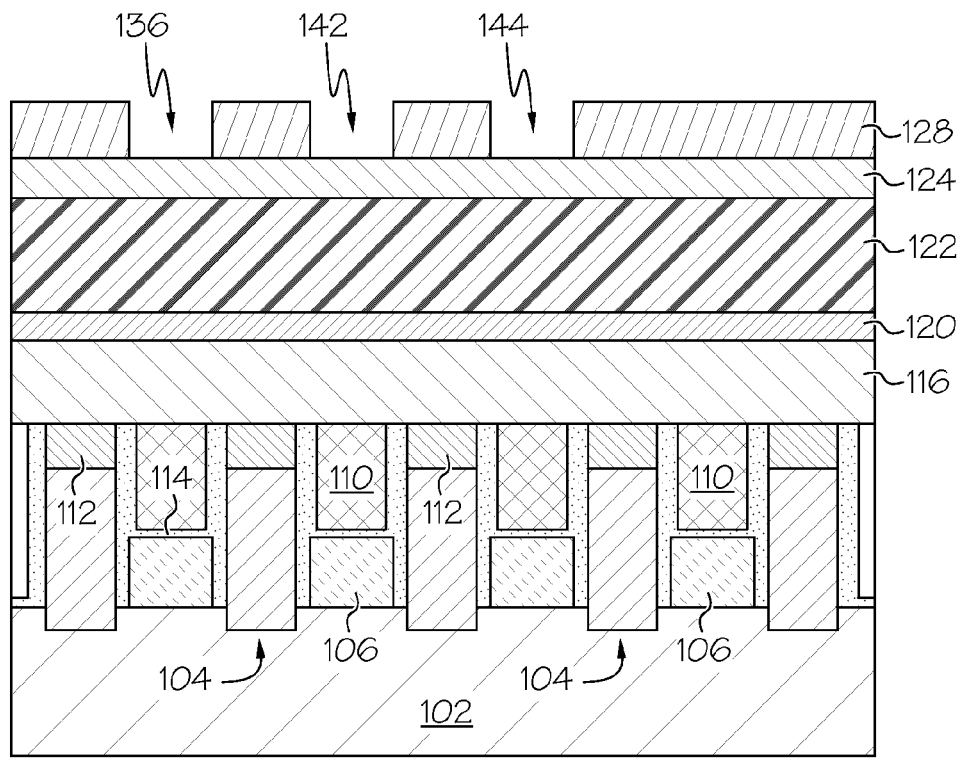
FIG. 7 shows a side cross-sectional view of the semiconductor device including a third contact opening formed in the memorization layer according to illustrative embodiments.

A plurality of contact openings are then formed in memorization layer 128 using a series of bi-layers of anti-reflective coating (ARC) and photoresist masking layers, as shown in FIGS. 3-5. In one embodiment, t, a first bi-layer 130 is formed on memorization layer 128 and with an opening 134 to define a first contact opening 136 (FIG. 4) of the plurality of contact openings. First patterning bi-layer 130 is then removed, resulting in semiconductor device 100 shown in FIG. 4. Second patterning bi-layer 138 is then formed on memorization layer 128 and with an opening 140 to define a second contact opening 142 of the plurality of contact openings, as shown in FIGS. 5-6. Second patterning bi-layer 138 is then removed, and the process is similarly repeated to form a third contact opening 144 of the plurality of contact openings, as shown in FIG. 7.

Figure 8:
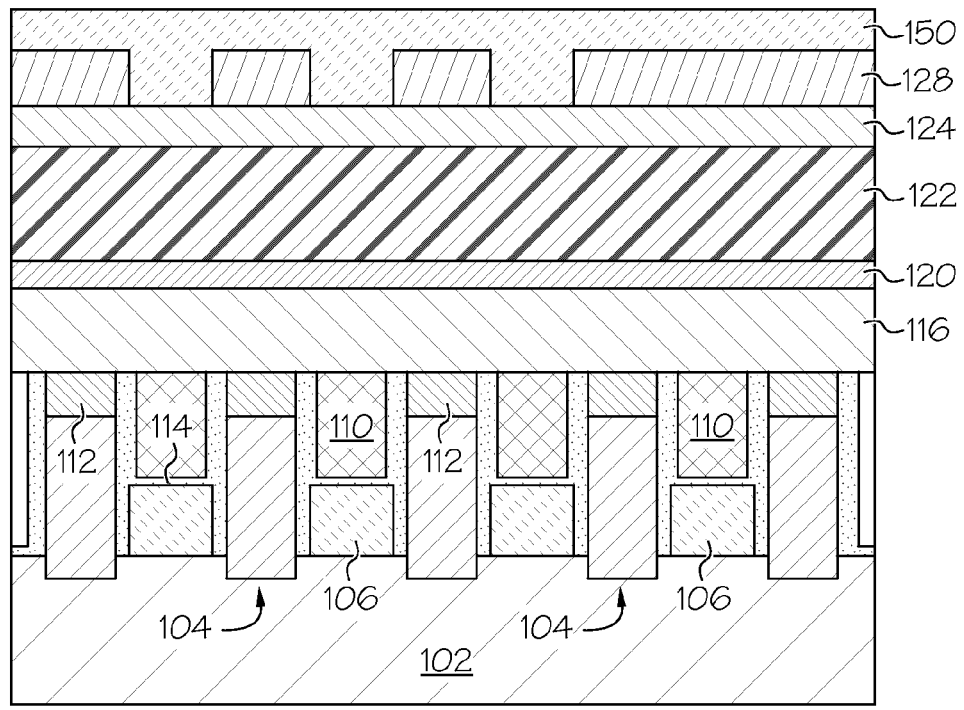
FIG. 8 shows a side cross-sectional view of the semiconductor device including a gap-fill material formed over the memorization layer according to embodiments of the invention.
Figure 9:
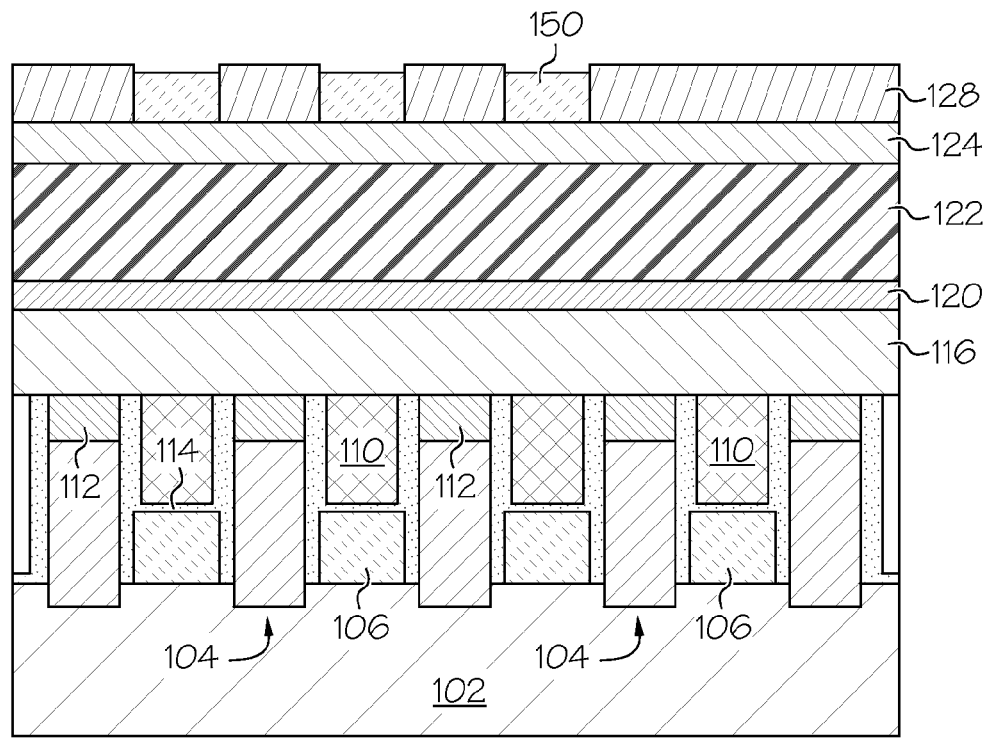
FIG. 9 shows a side cross-sectional view of the semiconductor device following an etch to the gap-fill material according to illustrative embodiments.

Next, as shown in FIG. 8, a gap-fill material 150 is deposited over semiconductor device 100, including within each of the plurality of contact openings 136, 142, and 144. In various embodiments, gap-fill material comprises at least one of: a-C, silicon oxycarbide (SiOC), silicon nitride (SiN), organic planarization layer (On), titanium nitride (TiN), and high-density plasma (HDP) nitride. Gap-fill material 150 is preferably self-planarizing, and capable of being etched back, as shown in FIG. 9. Here, gap-fill material 150 is removed from atop memorization layer 128, while remaining within each of the plurality of contact openings 136, 142, and 144.

It will be appreciated that different gap-fill materials may be optimally selected depending on the material of memorization layer 128. For example, in the case that memorization layer 128 comprises any of TEOS, LTO, or DUO, gap-fill material 150 can comprise any of flowable chemical vapor deposition (FCVD) oxide, SiOC, HDP nitride, or a-C. In another example, in the case that memorization layer 128 comprises either tow-temp a-Si or polySi, gap-fill material 150 can comprise any of DUO, FCVD oxide or SiOC.

Figure 10:
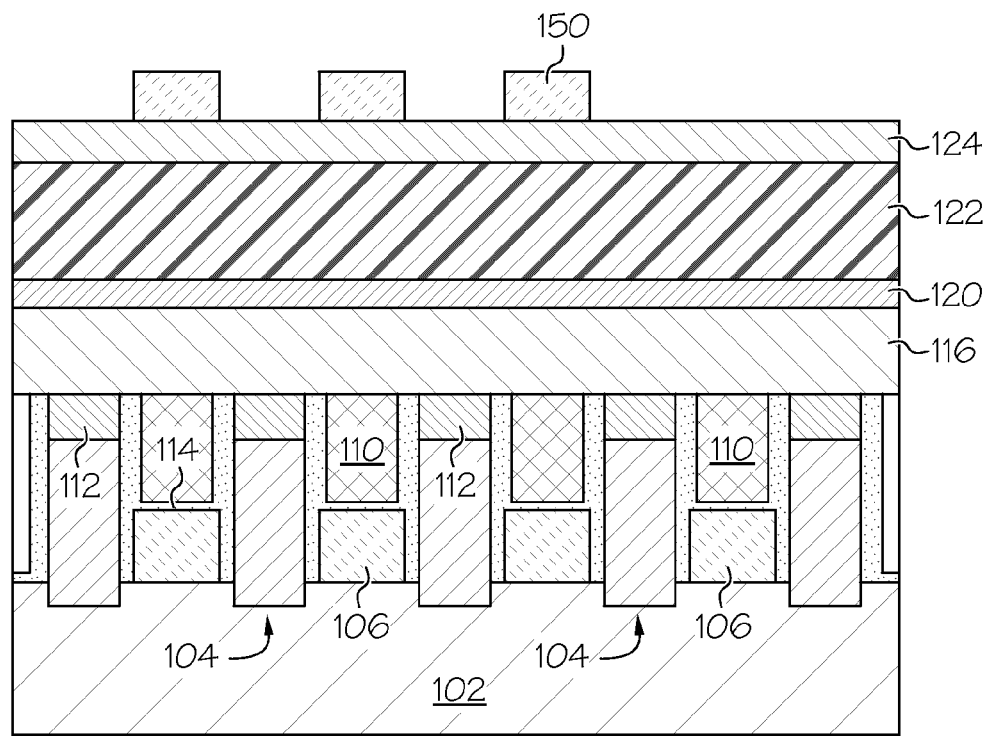
FIG. 10 shows a side cross-sectional view of the semiconductor device following removal of the memorization layer according to illustrative embodiments.
Figure 11:
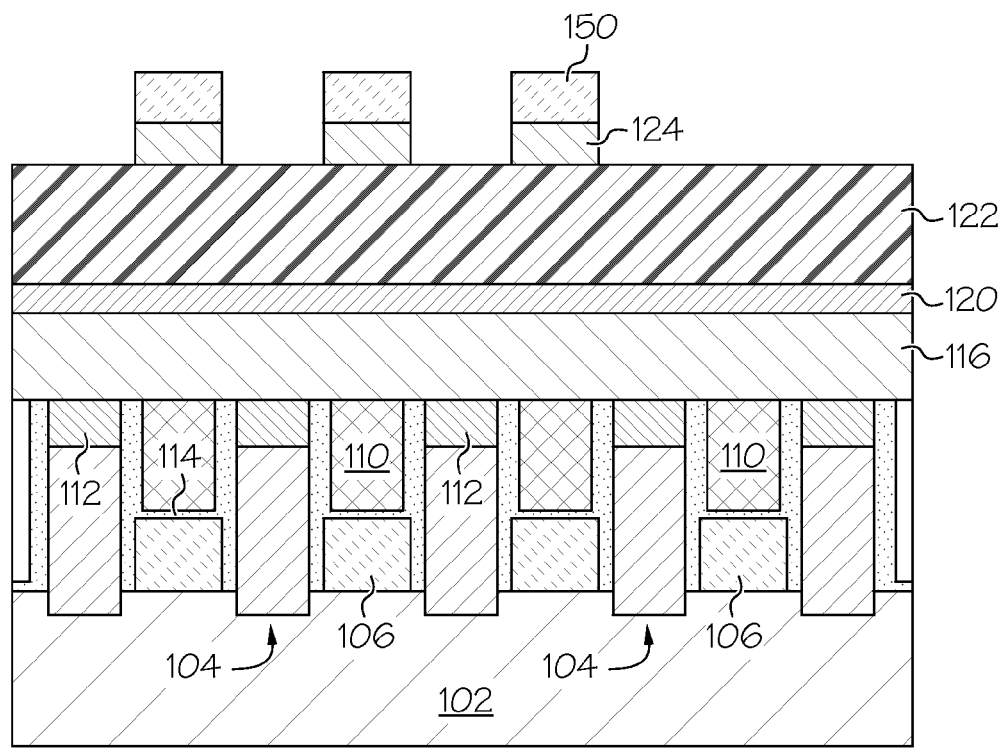
FIG. 11 shows a side cross-sectional view of the semiconductor device following removal of an etch stop layer according to illustrative embodiments.

Next, memorization layer 128 is removed (e.g., via a wet etch using a diluted hydrofluoric acid (DHF) in the case of an oxide or TMAH in the case of polySilicon), as demonstrated by semiconductor device 100 of FIG. 10, followed by a RIE to remove etch stop layer 124 adjacent gap-fill material 150, as demonstrated by semiconductor device 100 of FIG. 11. As shown, a portion of etch stop layer 124 remains beneath gap-fill material 150 in area over set of fins 106 and adjacent set of gate structures 104. The scheme allows for layer 150 to be thinned down during this step.

Figure 12:
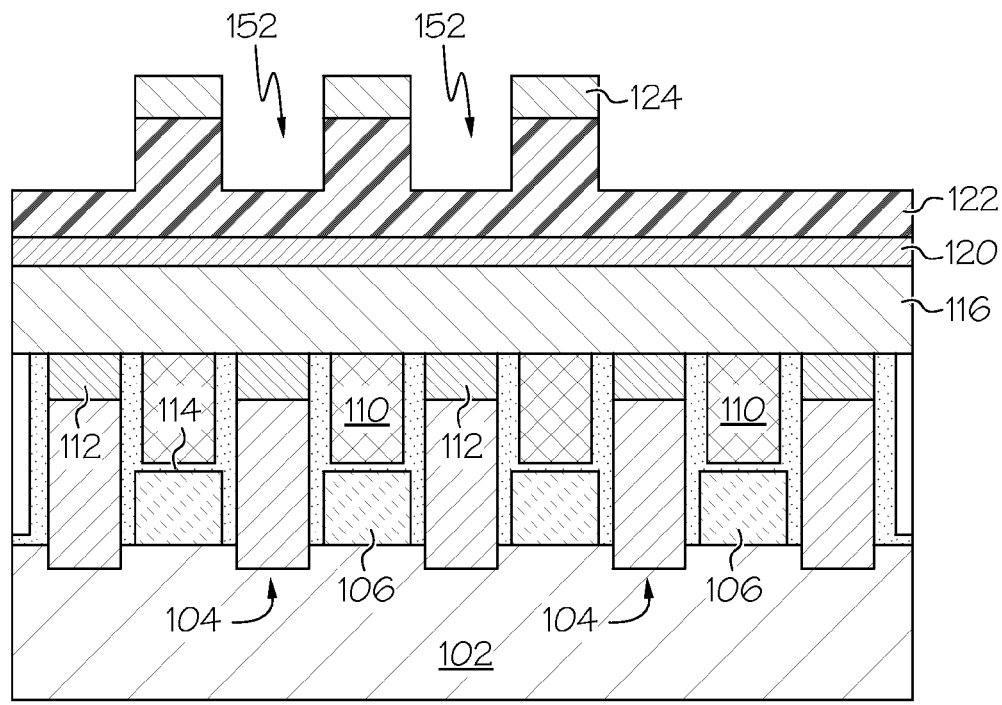
FIG. 12 shows a side cross-sectional view of the semiconductor device following an etch to a hardmask according to illustrative embodiments.
Figure 13:
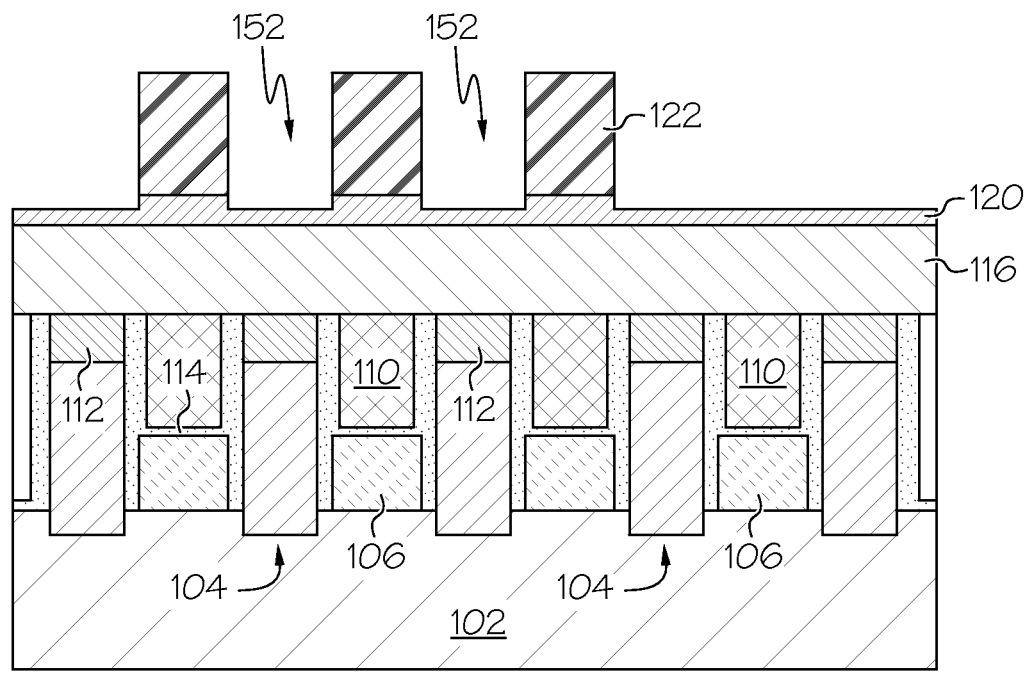
FIG. 13 shows a side cross-sectional view of the semiconductor device following a further etch to the hardmask according to illustrative embodiments.

Hardmask 122 is then etched to form a set of openings 152 above set of gate structures 104, as shown in FIG. 12. In this embodiment, the etch to hardmask 122 also removes gap-fill material 150 from atop the remaining portion(s) of etch stop layer 124. Hardmask 122 is then further etched, as shown by device 100 of FIG. 13, and the remaining portion(s) of etch stop layer 124 over set of gates 104 is removed from atop hardmask 122.

Figure 14:
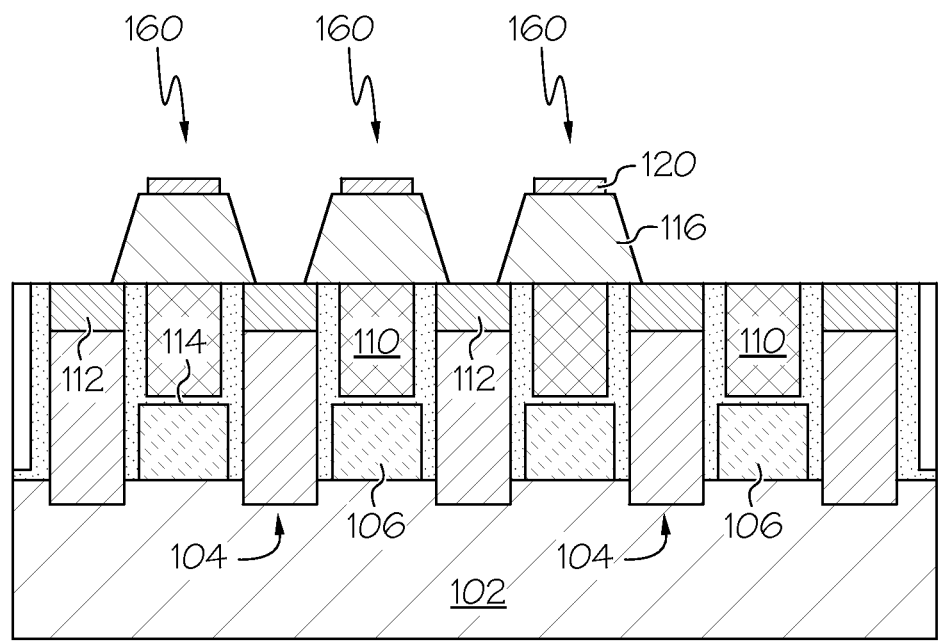
FIG. 14 shows a side cross-sectional view of the semiconductor device following an etch to a TEOS layer to form a set of dummy S/D contact pillars according to illustrative embodiments.

As shown in FIG. 14, a set of dummy Source/Drain (S/D) contact pillars 160 is then formed over fins 106 of semiconductor device 100 by etching dielectric layer 116 selective to gate capping layer 112 of each of set of gate structures 104, and selective also to CMPSL 120 that forms caps over (S/D) contact pillars 160. In one embodiment, dielectric layer 116 is removed using a RIE, wherein a portion of CMPSL 120 remains atop each of dummy S/D contact pillars 160.

In various embodiments, design tools can be provided and configured to create the datasets used to pattern the semiconductor layers as described herein. For example data sets can be created to generate photomasks used during lithography operations to pattern the layers for structures as described herein. Such design tools can include a collection of one or more modules and can also be comprised of hardware, software or a combination thereof. Thus, for example, a tool can be a collection of one or more software modules, hardware modules, software/hardware modules or any combination or permutation thereof. As another example, a tool can be a computing device or other appliance on which software runs or in which hardware is implemented. As used herein, a module might be implemented utilizing any form of hardware, software, or a combination thereof. For example, one or more processors, controllers, ASICs, PLAs, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Even though various features or elements of functionality may be individually described or claimed as separate modules, one of ordinary skill in the art will understand that these features and functionality can be shared among one or more common software and hardware elements, and such description shall not require or imply that separate hardware or software components are used to implement such features or functionality.

It is apparent that there has been provided approaches for patterning multiple, dense features in a semiconductor device using a memorization layer. While the invention has been particularly shown and described in conjunction with exemplary embodiments, it will be appreciated that variations and modifications will occur to those skilled in the art. For example, although the illustrative embodiments are described herein as a series of acts or events, it will be appreciated that the present invention is not limited by the illustrated ordering of such acts or events unless specifically stated. Some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated. Therefore, it is to be understood that the appended claims are intended to cover all such modifications and changes that fall within the true spirit of the invention.

What is claimed is:

1. A semiconductor device comprising:
a set of gate structures over a set of fins within a substrate;
a set of layers formed over the set of gate structures, the set of layers including a dielectric layer over the set of gate structures, a chemical mechanical planarization stop layer (CMPSL) over the dielectric layer, and a hardmask over the CMPSL; and
an etch stop layer and a gap-fill material formed over the hardmask in an area of the semiconductor device above the set of fins and adjacent to each of the set of gate structures.

2. The semiconductor device according to claim 1, the gap-fill material material comprising at least one of: a-C, silicon oxycarbide (SiOC), silicon nitride (SiN), organic planarization layer (OPL), titanium nitride (TiN), high-density plasma (HDP) nitride, deep ultraviolet light absorbing oxide (DUO), and flowable chemical vapor deposition (FCVD) oxide.

3. The method according to claim 1, the dielectric layer comprising a TEOS layer, the CMPSL comprising nitride, and the etch stop layer comprising silicon oxynitride.

4. The method according to claim 1, the hardmask comprising an amorphous-carbon (a-C) layer.

5. A semiconductor device comprising:
a set of gate structures over a set of fins within a substrate;
an oxide material formed between each pair of adjacent gate structures of the set of gate structures; and
a set of dummy source/drain (S/D) contact pillars formed over the oxide material, wherein the set of dummy S/D contact pillars comprises tetra ethyl ortho silicate (TEOS).

6. The semiconductor device of claim 5, further comprising a gate capping layer over each of the set of gate structures.

7. The semiconductor device of claim 5, wherein the set of dummy S/D contact pillars further comprises a chemical mechanical planarization stop layer (CMPSL).

8. The semiconductor device of claim 7, wherein the CMPSL comprises nitride.

* * * * *